United States Patent
Oyer et al.

(10) Patent No.: US 10,741,717 B1
(45) Date of Patent: Aug. 11, 2020

(54) SELF-ALIGNMENT PROCESS FOR MICRO LIGHT EMITTING DIODE USING BACK-SIDE EXPOSURE

(71) Applicant: Facebook Technologies, LLC, Menlo Park, CA (US)

(72) Inventors: Celine Claire Oyer, Cork (IE); David Massoubre, Cork (IE); Tilman Zehender, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/356,850

(22) Filed: Mar. 18, 2019

Related U.S. Application Data

(60) Provisional application No. 62/651,048, filed on Mar. 30, 2018.

(51) Int. Cl.
*H01L 33/00* (2010.01)
*H01L 33/40* (2010.01)
*H01L 33/44* (2010.01)
*H01L 33/32* (2010.01)

(52) U.S. Cl.
CPC ............ *H01L 33/007* (2013.01); *H01L 33/40* (2013.01); *H01L 33/44* (2013.01); *H01L 33/32* (2013.01); *H01L 2933/0016* (2013.01); *H01L 2933/0025* (2013.01)

(58) Field of Classification Search
None
See application file for complete search history.

(56) References Cited

U.S. PATENT DOCUMENTS

2008/0194049 A1* 8/2008 Wuu .................. H01L 33/38 438/26
2015/0349207 A1* 12/2015 Sogo .................. H01L 33/0079 257/99

* cited by examiner

*Primary Examiner* — Bradley Smith
(74) *Attorney, Agent, or Firm* — Fenwick & West LLP

(57) ABSTRACT

Embodiments relate to a micro light-emitting-diode (µLED) fabricated using a self-aligned process. To fabricate the µLED, a metal layer is deposited on a p-type semiconductor. The p-type semiconductor is on an n-type semiconductor and the n-type semiconductor is on a top side of a substrate. The metal layer is patterned to define a p-metal. The p-type semiconductor is etched using the p-metal as an etch mask. Similarly, the n-type semiconductor is etched using the p-metal and the p-type semiconductor as an etch mask. A negative photoresist layer is deposited over the patterned p-metal and the p-type semiconductor. The negative photoresist is then exposed from the back side of the substrate, thus exposing the regions of the negative photoresist that are not masked by the p-metal. The negative photoresist is then developed to expose the p-metal.

20 Claims, 9 Drawing Sheets

SELF-ALIGNMENT PROCESS FOR MICRO LIGHT EMITTING DIODE USING BACK-SIDE EXPOSURE

CROSS-REFERENCE TO RELATED APPLICATION

This application claims priority under 35 U.S.C. § 119(e) to U.S. Provisional patent application No. 62/651,048 filed on Mar. 30, 2018, which is incorporated by reference herein in its entirety.

BACKGROUND OF THE INVENTION

1. Field of the Disclosure

The present disclosure relates to micro LED (µLED) fabrication and more specifically to µLED fabrication using self-alignment.

2. Description of the Related Art

Micro light-emitting diode (µLED) display are an emerging flat panel display technology that includes microscopic light-emitting diodes (LEDs) for displaying images. Compared to liquid crystal display (LCD) technology, µLED display devices offer improved contrast, faster response time, and lower energy consumption. However, as the size of µLEDs decreases, the alignment constraints for the µLEDs becomes more strict. Such strict alignment constrains, increases the difficulty in fabricating the µLEDs.

SUMMARY

Embodiments relate to a micro light-emitting-diode (µLED) fabricated using a self-aligned process. To fabricate the µLED, a metal layer is deposited on a p-type semiconductor. The p-type semiconductor is on an n-type semiconductor and the n-type semiconductor is on a top side of a substrate. The metal layer is patterned to define a p-metal. The p-type semiconductor is etched using the p-metal as an etch mask. Similarly, the n-type semiconductor is etched using the p-metal and the p-type semiconductor as an etch mask.

A negative photoresist layer is deposited over the patterned p-metal and the p-type semiconductor. The negative photoresist is then exposed from the back side of the substrate, thus exposing the regions of the negative photoresist that are not masked by the p-metal. The negative photoresist is then developed to expose the p-metal.

BRIEF DESCRIPTION OF THE DRAWINGS

The teachings of the embodiments can be readily understood by considering the following detailed description in conjunction with the accompanying drawings.

Figure (FIG. 1 illustrates a cross-sectional view of micro light-emitting diodes (µLED), according to one embodiment.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Embodiments relate to a process for fabricating micro light-emitting diodes (µLED). The fabrication process disclosed herein uses a self-aligned process to form p-electrodes on a p-doped semiconductor layer (e.g., Gallium Nitride) to form one or more µLEDs.

A "µLED" or "micro-LED" described herein refers to a particular type of LED having a small active light emitting area (e.g., less than 2,000 $\mu m^2$), transparency or substantial transparency to emitted visible light (e.g., from another µLED of another display panel). In particular, the diameter of each µLED and the pitch, or spacing between µLEDs, is on the order of 0.1-10 µm.

Figure 1:
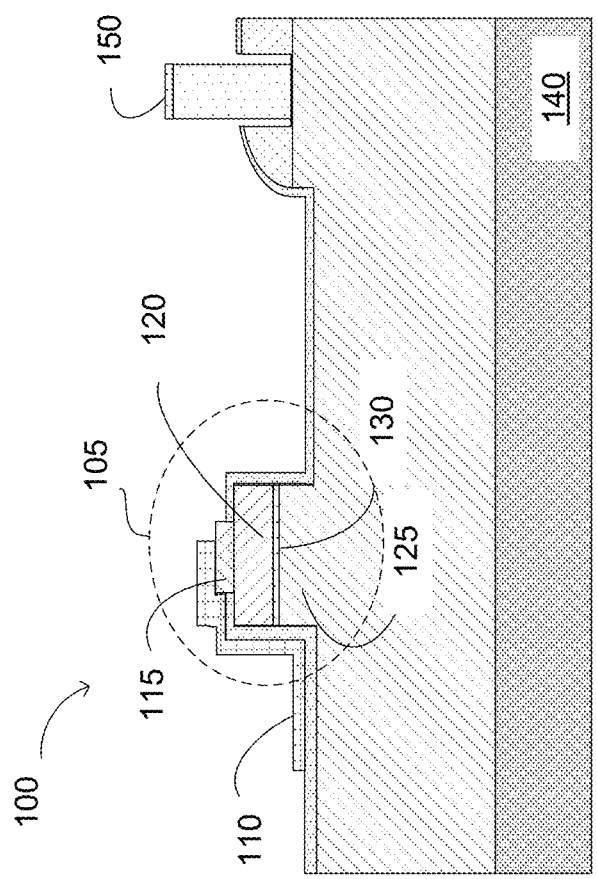

FIG. 1 illustrates a cross-sectional view of a micro light-emitting diode (µLED), according to one embodiment. FIG. 1 illustrates a µLED 105 and an n-electrode 150. The µLED 105 include a p-type layer 120, an n-type layer 125, and a quantum well (QW) 130 as an active layer. In some embodiments, gallium nitride (GaN) is used as the basis material, which are selectively doped with dopants such as Si (for n-type layer) and Mg (for the p-type layer). In some embodiments, the GaN layers are grown on top of a transparent substrate 140. For instance, the transparent substrate may be a sapphire substrate or an indium tin oxide (ITO) substrate.

The µLED 105 further include a p-electrode 115 over the p-type layer 120 and a contact 110 for connecting to the p-electrode 115. In some embodiments, multiple µLEDs share a single n-electrode 150. For instance, the n-electrode may be coupled to ground or a negative supply voltage. Moreover, each µLED may have a separate p-electrode, such that each µLED may be independently controlled. The µLED 105 may include additional layers such as a barrier layer not illustrated in FIG. 1.

Figure 2:
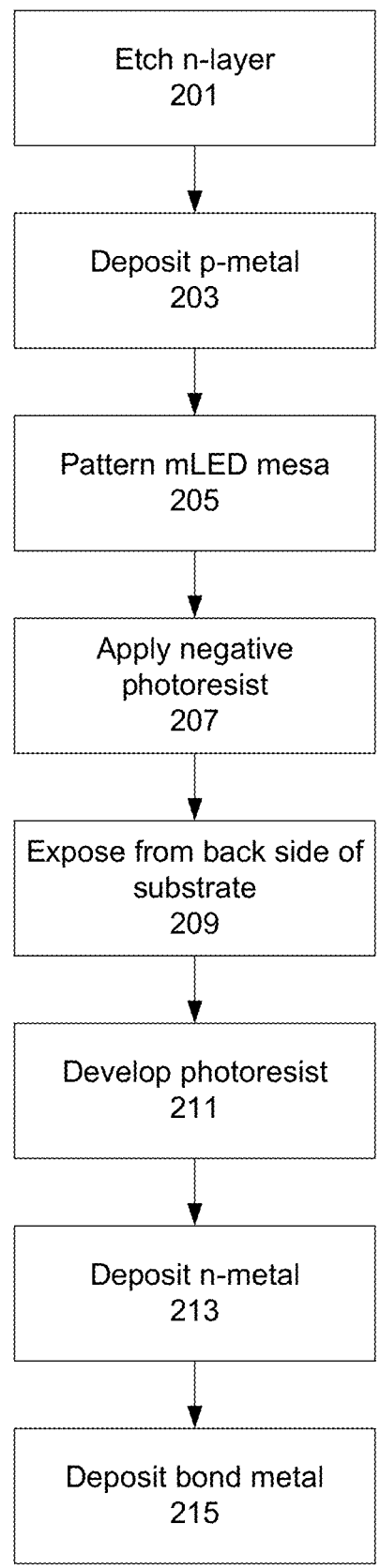
FIG. 2 illustrates a flowchart of a process for fabricating a µLED, according to one embodiment.
Figure 3A:
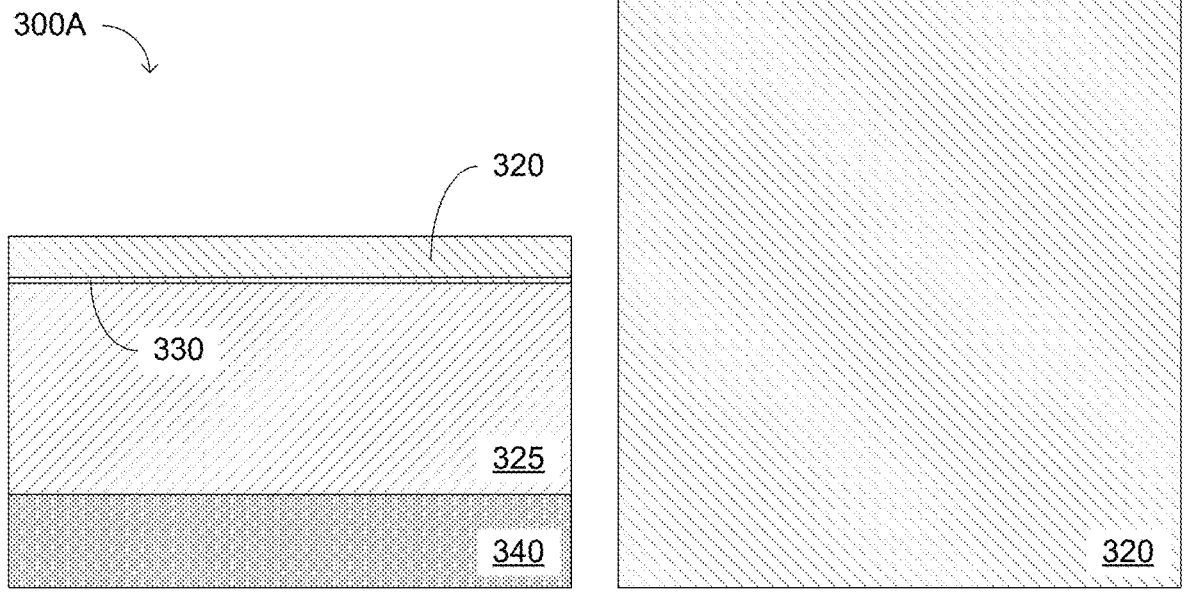
FIGS. 3A-3K illustrate cross-sectional views and top views of various fabrication steps of µLEDs, according to one embodiment.

FIG. 2 illustrates a flow chart of a process for fabricating a µLED, according to one embodiment. FIGS. 3A through 3K show cross-sectional views and top views of a µLED at various steps of the process illustrated in FIG. 2. The self-aligned µLED fabrication process starts with a stack 300A including a substrate 340, an n-type layer 325 (e.g., n-type gallium nitride (N—GaN)), a quantum well (QW) 330 as an active layer, and a p-type layer 320 (e.g., p-type gallium nitride (P—GaN)). FIG. 3A illustrates the stack at the beginning of the flow shown in FIG. 2.

Figure 3B:
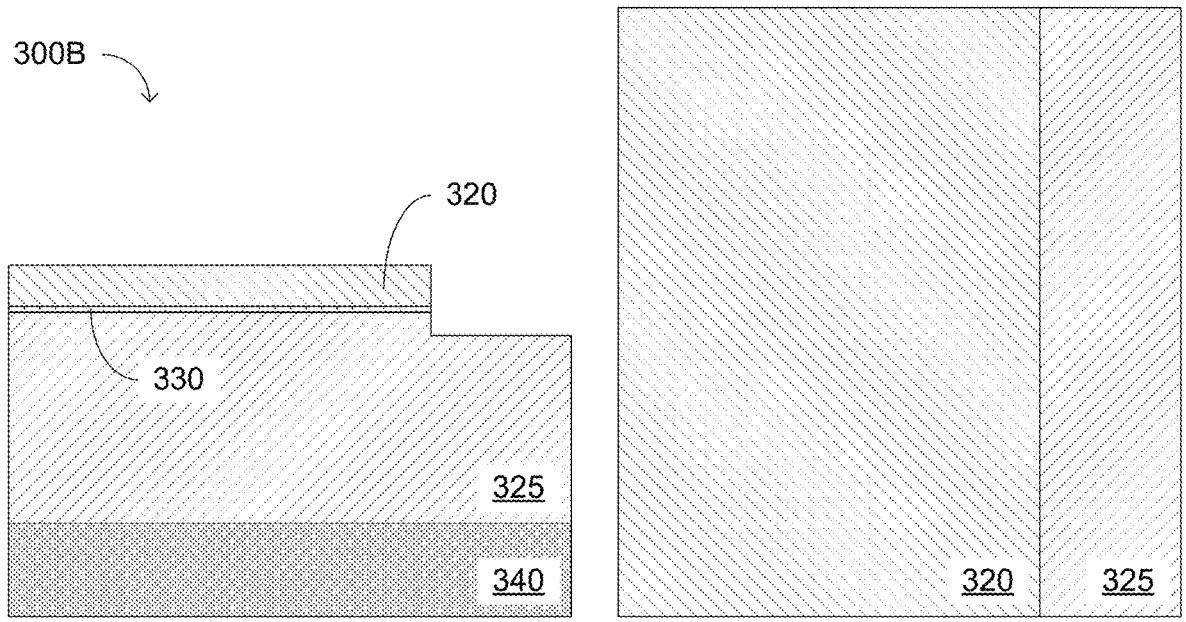

The stack 300A is etched 201 to expose the n-type layer 325, resulting in stack 300B illustrated in FIG. 3B. In some embodiments, the stack is etched using dry etching. In one embodiment, the dry etching is stopped approximately 100 nm to 2000 nm below the QW 330.

Instead of a single quantum well as illustrated in FIG. 3A through 3K, the active layer of µLED may be embodied as multiple quantum wells, quantum dots or quantum wires.

In other embodiments, if the etching method is not selective between the p-type layer 320 and the n-type layer 325, the amount of etching is controlled by calculating the time to etch the height of the p-type layer 320 and a predetermined height (e.g., 300 nm) of the s-type layer 325. The time is calculated based on an etching rate for the p-type layer and the re-type layer of the etching method being used.

Figure 3C:
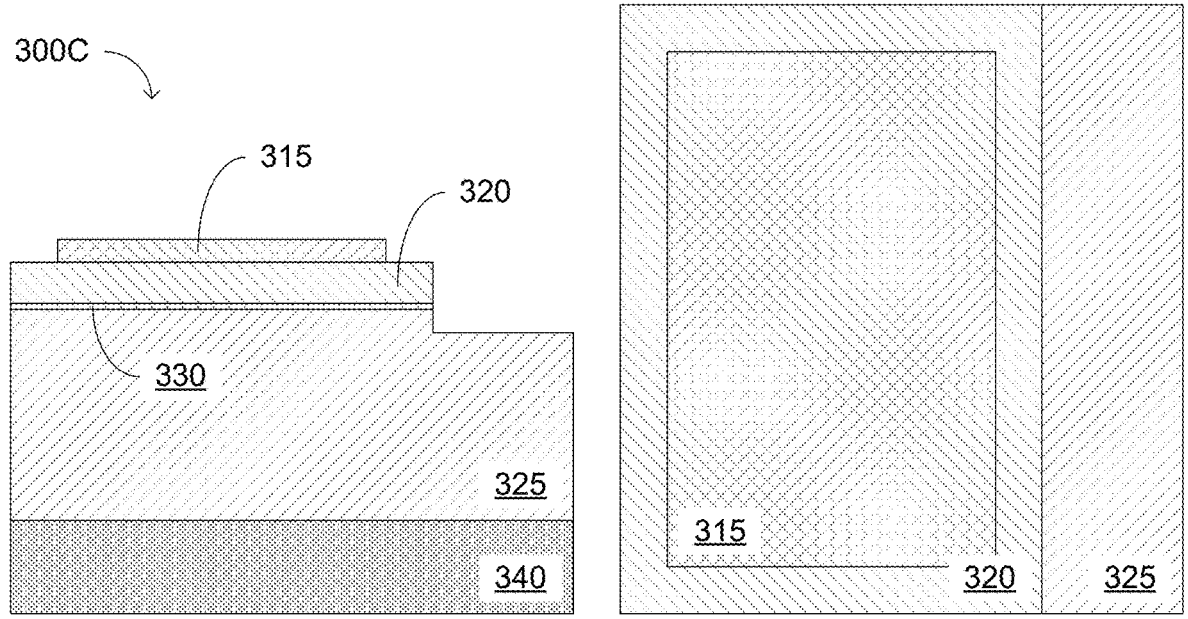
Figure 3D:
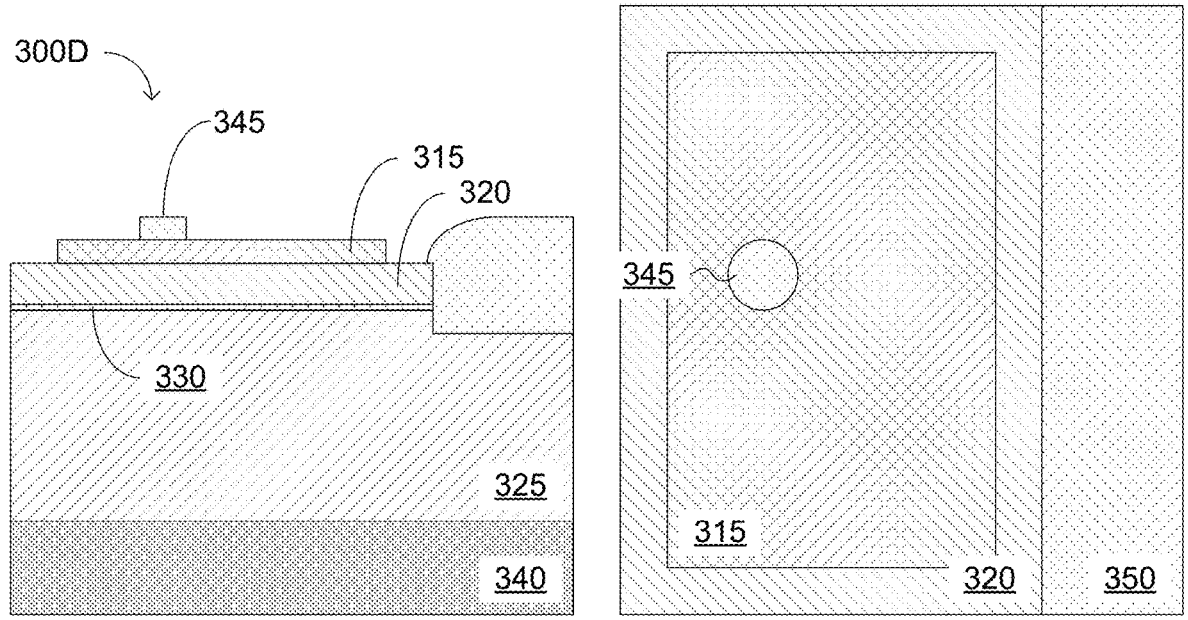

P-metal 315 is deposited 203 on the p-type layer 320 resulting stack 300C illustrated in FIG. 3C. The p-metal 315 may be made of nickel gold (NiAu), silver (Ag), aluminum (Al) or other similar metal. In some embodiments, an adhesion layer is deposited before depositing the p-metal to aid the adhesion of the p-metal 315 and the p-type layer 320.

Figure 3E:
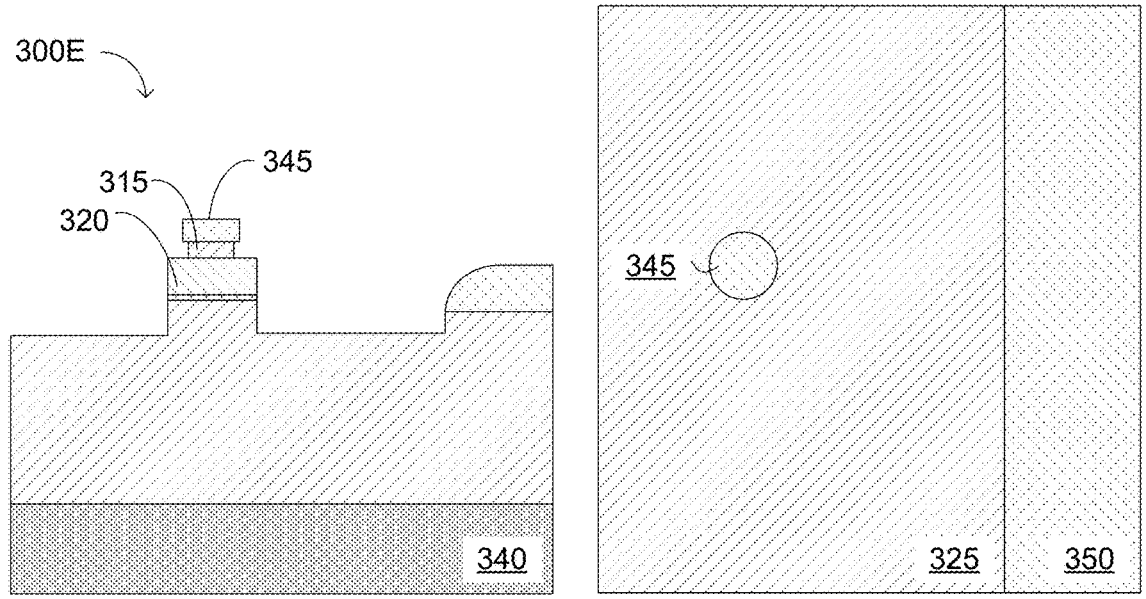

The stack 300C is patterned 205 to form a μLED structure. To pattern the μLED structure, photoresist 345 is applied and patterned to form the stack 300D illustrated in FIG. 3D. The stack 300D is then etched through the p-metal 315, the p-type layer 320, the QW 330 and the n-type layer 325 to form an individual μLED structure as illustrated in FIG. 3E. In some embodiments, the p-metal 315 is wet etched to form an undercut. The undercut from sides may be less than half the diameter of the p-metal 315, for example, 1 μm on each side. In other embodiments, the undercut reduces the area of the p-metal by 90%. In other embodiments, the undercut reduces the area of the p-metal by over 90% (e.g., 97%). In some embodiments, where the μLED structure has a diameter of 30 μm or larger, the undercut reduces the area of the p-metal by 30% (e.g., an undercut of 2.5 μm on each side). In other embodiments, other undercut dimensions may be used. Furthermore, the p-type layer 320, QW 330, and the n-type layer 325 may be dry etched to achieve a desired profile. In yet other embodiments, there may be no undercut in the p-metal 315.

As a result, the p-metal is self-aligned onto the μLED structure as illustrated in FIG. 3E. Because the p-metal is formed on the μLED mesa through a self-aligned process, a separate alignment step for aligning the p-metal to the μLED structure can be removed, and the alignment between the p-metal and the μLED structure is improved. By having the p-metal to be self-aligned to the μLED structure, the fabrication of the μLED with tighter misalignment tolerances can be beneficially enabled and the use of expensive alignment steps is obviated.

Figure 3F:
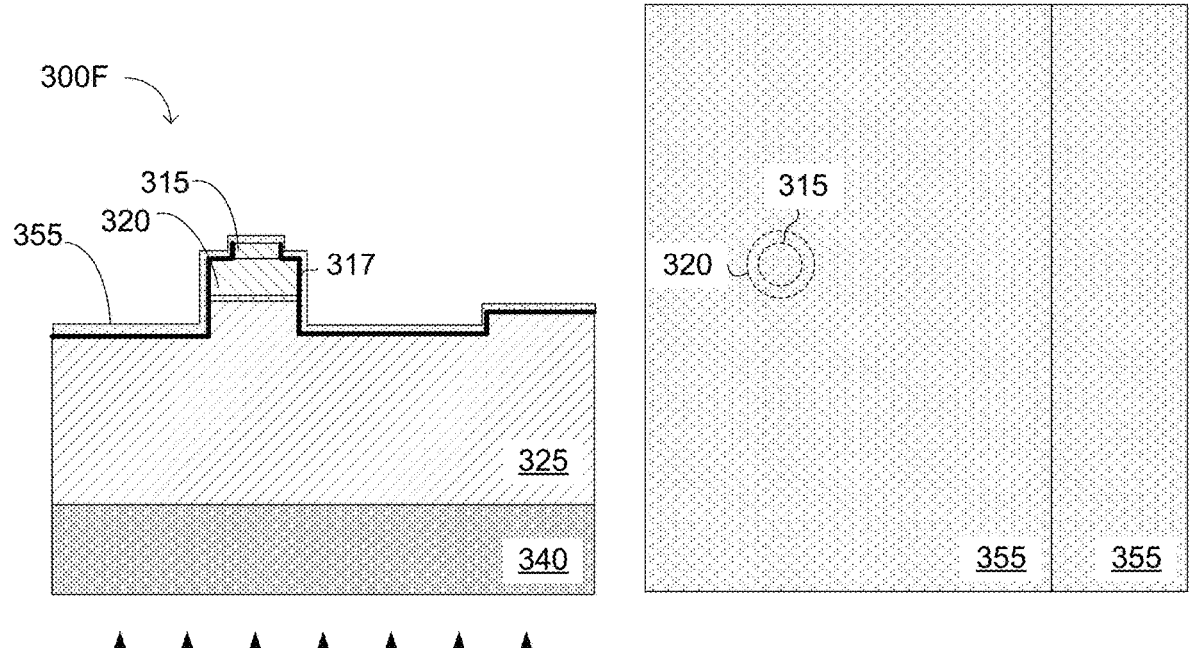

As shown in FIG. 3F, the photoresist 345 is then removed and applied with negative photoresist 355. As used herein, negative photoresist is a type of photoresist in which the portion of the photoresist that is exposed to light becomes insoluble to the photoresist developer. That is, the unexposed portion of the photoresist can be dissolved by the photoresist developer.

In some embodiments, a dielectric layer (e.g., an oxide or nitride) 317 is deposited or grown and an opening is made on top of the p-metal 315 before applying the negative photoresist 355. The dielectric layer 317 covers the n-type layer 325, side walls of the quantum well 330 as well as sides and the top of the p-type layer 320. In an alternative embodiment, the negative photoresist 355 subsequently functions as a dielectric material (e.g., after annealing), and therefore, obviates the need to deposit a separate dielectric layer. Materials that function as both the negative photoresist and the dielectric material may include, among others SU-8 based material or benzocyclobutene (BCB).

Figure 3G:
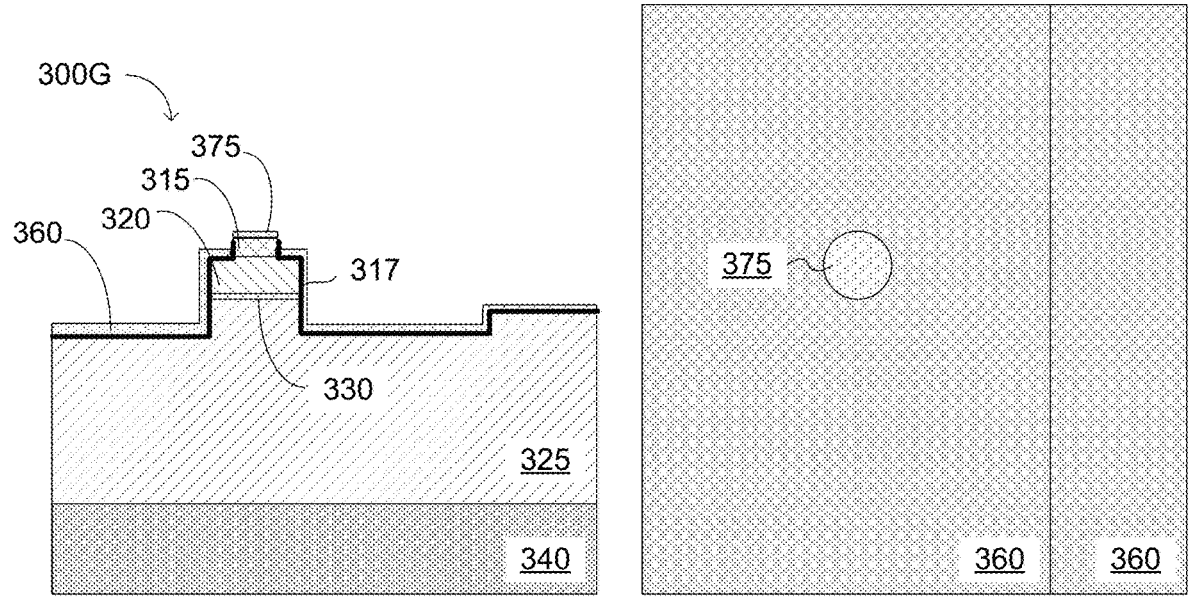

The negative photoresist 355 is exposed 209 from the backside of the substrate 340. As such, p-metal 315 acts as a mask for the negative photoresist 355. Thus, as illustrated in FIG. 3G, portions 360 of negative photoresist 355 are exposed, becoming insoluble to the photoresist develop, while portions 375 of photoresist 355 are masked from the exposure, remaining soluble to the photoresist developer. In particular, since a transparent substrate is used, the only regions that are masked from being exposed are the regions where the p-metal 315 is present. In some embodiments, the negative photoresist is selected such that the thickness of the negative photoresist is smaller than the thickness of the p-metal. In other embodiments, the thickness of the p-metal is selected based on the thickness of the available negative photoresist.

Figure 3H:
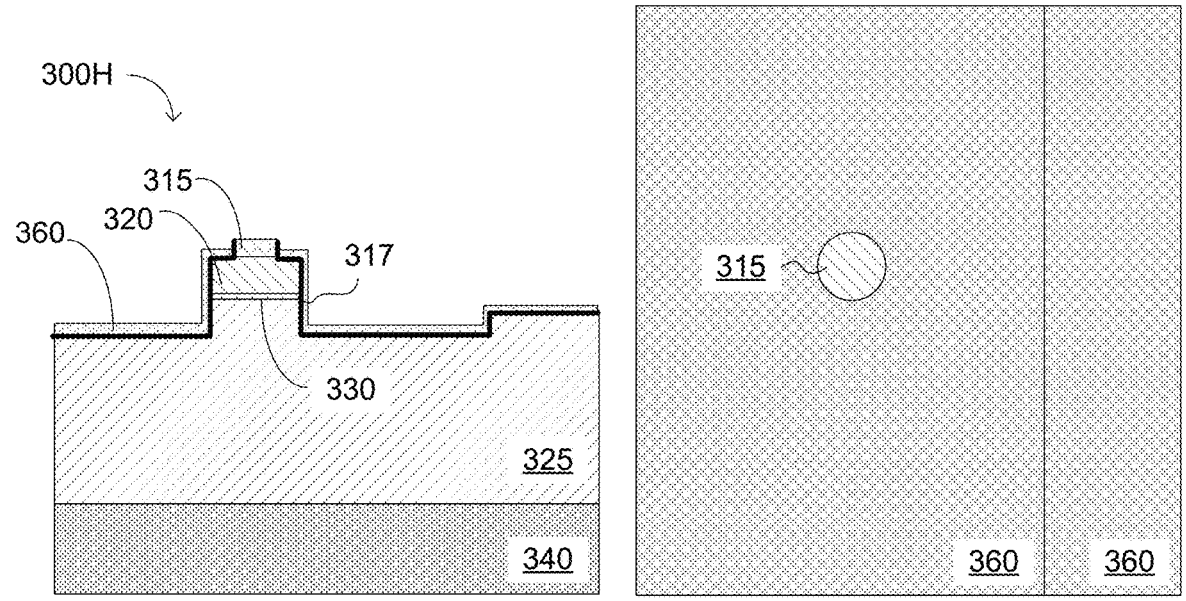
Figure 3I:
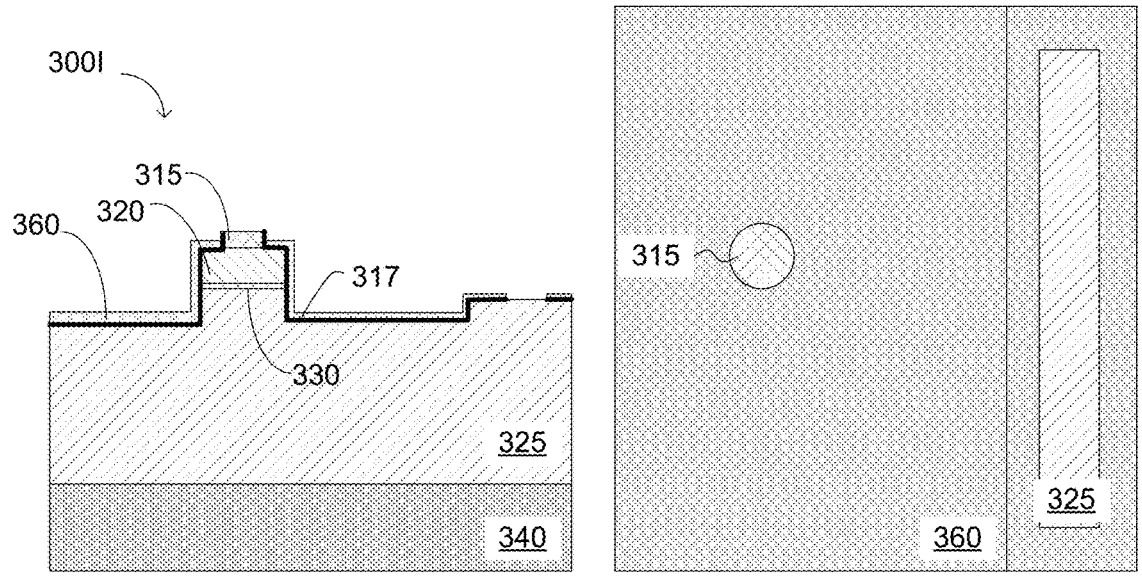

Then, the photoresist 355 is developed 211, as shown in FIG. 3H. In some embodiments, an insulating layer is etched using the exposed negative photoresist 360 as a mask for the etching process. Thus, the p-metal is exposed, while other regions are kept masked by the negative photoresist 360. The exposure of the p-metal performed in this manner is self-aligned to the p-metal 315 itself. That is, the p-metal can be completely exposed without exposing the layers underneath the p-metal without using an alignment step. This relaxes the constraint for an accurate alignment method and allows fabrication of μLEDs with smaller feature sizes and pitch sizes. By having the opening of the p-metal to be self-aligned, the fabrication of the μLEDs with tighter misalignment tolerances can be enabled without the use of expensive alignment steps.

Then, N-metal 370 is deposited 213. In some embodiments, as show in FIG. 3I, the region where the n-metal 370 is to be located is etched to expose the n-type layer 325 before depositing the n-metal 370. Furthermore, as shown in FIG. 3J, after depositing a metal layer for forming the n-metal 370, the deposited metal layer may be patterned.

Figure 3J:
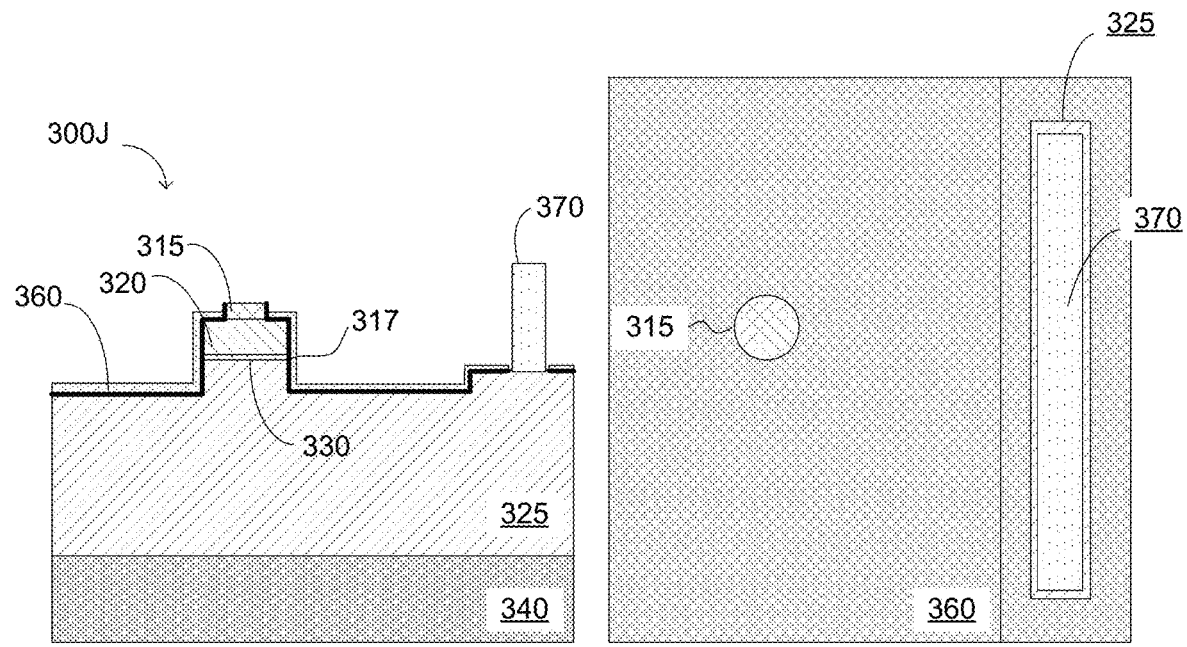

Bond metal 365 is deposited 215 as illustrated in FIG. 3J. In some embodiments, the bond metal 365 is deposited on top of the p-metal 315 and on top of the n-metal 370. In some embodiments, the bond metal may be a titanium-gold (TiAu) alloy. In some embodiments, additional layers, such as a passivation layer and a seed metal layer is deposited on top of the stack 300L of FIG. 3K.

As such, the two alignment steps for aligning the p-metal 115 to the p-layer 120, and for exposing the p-metal are eliminated. Thus, the disclosed process allows the fabrication of a μLED with fewer alignment steps, reducing the complexity of the fabrication process.

Figure 3K:
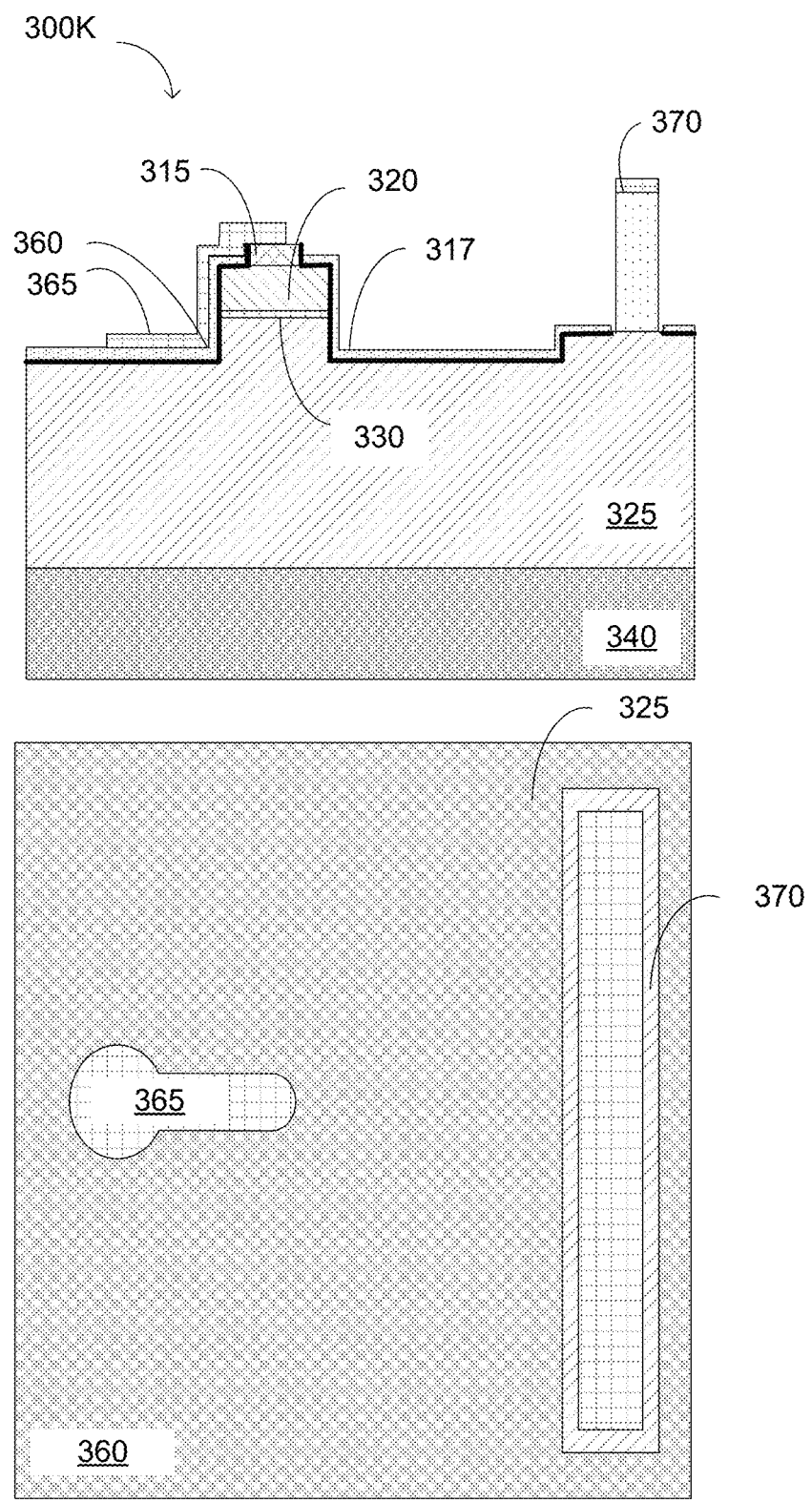

Although only one μLED is illustrated in FIG. 3K, multiple μLEDs in various patterns may also be formed.

Figure 4:
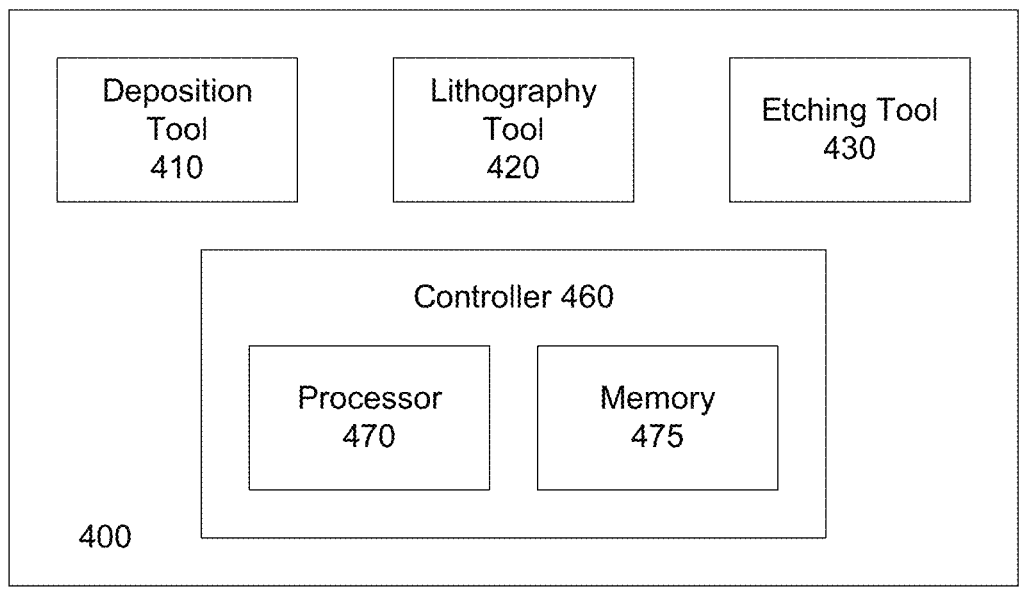
FIG. 4 illustrates a block diagram of a device 400 for manufacturing the µLEDs, according to one embodiment.

FIG. 4 illustrates a block diagram of a device 400 for manufacturing the μLEDs, according to one embodiment. The device 400 includes a deposition tool 410, a lithography tool 420, an etching tool 430, and a controller 460.

The deposition tool 410 deposits layers of material onto a substrate. The deposition tool 410 may use techniques such as molecular beam epitaxy (MBE), chemical vapor deposition (CVD), physical vapor deposition (PVD) and atomic layer deposition (ALD) to deposit or grow layers of material onto a substrate.

The lithography tool 420 transfers geometric patterns from a photomask to a light-sensitive chemical photoresist. The lithography tool 420 may include tools to deposit or spin coat photoresist onto a substrate, align the photomask to the substrate, expose the photoresist, and develop the photoresist. In some embodiments, the lithography tool further includes tools to remove the photoresist from the substrate.

The etching tool 430 chemically or physically removes layers from the surface of a substrate. The etching tool 430 may include tools for performing wet etching and/or dry etching. The etching tool 430 may be configured to follow pre-determined recipes based on the type of material being etched.

The controller 460 controls the fabrication process of the µLEDs. The controller 460 includes a processor 470 and a memory 475. The memory 475 stores the sequence of steps and the recipes to be followed for fabricating the µLEDs. For instance, the memory 475 stores the steps illustrated in the flowchart of FIG. 2. The processor retrieves the steps stored in memory 475 and instructs each of the tools 410, 420, and 430 to perform the steps for fabricating the µLEDs.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A method of fabricating a light emitting diode (LED) device, comprising:
    depositing a metal layer on a p-type semiconductor, the p-type semiconductor disposed on an n-type semiconductor, the n-type semiconductor disposed on a top side of a substrate;
    patterning the metal layer to define a p-metal;
    etching the p-type semiconductor, the etching of the p-type semiconductor aligned to the patterned p-metal;
    depositing a negative photoresist layer, the negative photoresist layer over the patterned p-metal and the p-type semiconductor;
    exposing the negative photoresist from a back side of the substrate at an opposite side of the top side of the substrate; and
    developing the negative photoresist to expose the p-metal.

2. The method of claim 1, wherein the exposure of portions of the negative photoresist is masked by the p-metal underneath the negative photoresist.

3. The method of claim 1, further comprising:
    depositing a bond metal over the developed negative photoresist, wherein the bond metal is in contact the exposed p-metal.

4. The method of claim 1, wherein the developed negative photoresist is dielectric material.

5. The method of claim 1, further comprising:
    wet etching a side surface of the p-metal to form an undercut.

6. The method of claim 1, wherein patterning the metal layer comprises:
    depositing a layer of photoresist over the metal layer;
    patterning the layer of photoresist; and
    etching the metal layer based on the patterned layer of photoresist.

7. The method of claim 1, wherein an active layer is disposed between the p-type semiconductor and the n-type semiconductor, and wherein the method further comprises:
    etching the active layer and the n-type semiconductor, the etching of the active layer and the n-type semiconductor in alignment with the patterned p-metal.

8. The method of claim 7, wherein the active layer and at least a portion of the n-type semiconductor are etched in alignment with the patterned p-metal.

9. The method of claim 1, further comprising:
    depositing a dielectric layer over the etched p-type semiconductor and the p-metal,
    forming an opening of the dielectric layer on the p-metal, wherein the negative photoresist is deposited over the dielectric layer, and
    wherein the dielectric layer is etched in alignment with the developed negative photoresist.

10. The method of claim 9, wherein the dielectric layer comprises an oxide or nitride.

11. The method of claim 9, wherein the dielectric layer is disposed at least on a side of the etched p-type semiconductor.

12. A light-emitting-diode (LED) fabricated by a process comprising the steps of:
    depositing a metal layer on a p-type semiconductor, the p-type semiconductor disposed on an n-type semiconductor, the n-type semiconductor disposed on a top side of a substrate;
    patterning the metal layer to define a p-metal;
    etching the p-type semiconductor, the etching of the p-type semiconductor in alignment with the patterned p-metal;
    depositing a negative photoresist layer, the negative photoresist layer over the patterned p-metal and the p-type semiconductor;
    exposing the negative photoresist from a back side of the substrate at an opposite side of the top side of the substrate; and
    developing the negative photoresist to expose the p-metal.

13. The LED of claim 12, wherein the exposure of portions of the negative photoresist is masked by the p-metal underneath the negative photoresist.

14. The LED of claim 12, further fabricated by a process comprising the steps of:
    depositing a bond metal over the developed negative photoresist, wherein the bond metal is in contact the exposed p-metal.

15. The LED of claim 12, wherein the developed negative photoresist is dielectric material.

16. The LED of claim 12, further fabricated by a process comprising the steps of:
    wet etching a side surface of the p-metal to form an undercut.

17. The LED of claim 12, wherein patterning the metal layer comprises:
    depositing a layer of photoresist over the metal layer;
    patterning the layer of photoresist; and
    etching the metal layer based on the patterned layer of photoresist.

18. The LED of claim 12, wherein a thickness of the metal layer is greater than a thickness of the negative photoresist.

19. The LED of claim 12, wherein an active layer is disposed between the p-type semiconductor and the n-type semiconductor, and wherein the method further comprises:
    etching the active layer and the n-type semiconductor, the etching of the active layer and the n-type semiconductor in alignment with the patterned p-metal.

20. A non-transitory computer readable storage medium configured to store instructions, the instructions, when executed by a fabrication tool, cause the fabrication tool to:
    deposit a metal layer on a p-type semiconductor, the p-type semiconductor disposed on an n-type semiconductor, the n-type semiconductor disposed on a top side of a substrate;
    pattern the metal layer to define a p-metal;
    etch the p-type semiconductor, the etching of the p-type semiconductor in alignment with the patterned p-metal;

deposit a negative photoresist layer, the negative photoresist layer over the patterned p-metal and the p-type semiconductor;
expose the negative photoresist from a back side of the substrate at an opposite side of the top side of the substrate; and
develop the negative photoresist to expose the p-metal.

\* \* \* \* \*